(12) United States Patent
Chang (10) Patent No.: US 9,966,920 B2
(45) Date of Patent: May 8, 2018

(54) POWER AMPLIFIER CIRCUIT AND OPERATING METHOD THEREOF

(71) Applicant: Airoha Technology Corp., Hsinchu (TW)

(72) Inventor: Chun-Hsiung Chang, Zhubei (TW)

(73) Assignee: AIROHA TECHNOLOGY CORP., Hsinchu (TW)

( * ) Notice: Subject to any disclaimer, the term of this patent is extended or adjusted under 35 U.S.C. 154(b) by 0 days. days.

(21) Appl. No.: 15/413,544

(22) Filed: Jan. 24, 2017

(65) Prior Publication Data

US 2017/0214368 A1 Jul. 27, 2017

(30) Foreign Application Priority Data

Jan. 27, 2016 (TW) .............. 105102503 A (51) Int. Cl.
*H03F 3/04* (2006.01)
*H03G 3/30* (2006.01)
*H03F 3/19* (2006.01)
*H03F 3/21* (2006.01)
*H03F 1/02* (2006.01)

(52) U.S. Cl.
CPC ......... *H03G 3/3042* (2013.01); *H03F 1/0216* (2013.01); *H03F 3/19* (2013.01); *H03F 3/21* (2013.01); *H03F 2200/405* (2013.01); *H03F 2200/451* (2013.01); *H03F 2200/516* (2013.01)

(58) Field of Classification Search
CPC .............................. H03F 1/0211; H03F 1/0216
USPC .................. 330/127, 133, 285, 297
See application file for complete search history.

(56) References Cited

U.S. PATENT DOCUMENTS

| 7,132,891 | B1 | 11/2006 | Dening et al. |
| 7,196,583 | B2 | 3/2007 | Clifton et al. |
| 7,339,426 | B2 * | 3/2008 | Gurvich ............. H03F 1/0211 330/136 |
| 7,440,733 | B2 * | 10/2008 | Maslennikov ........ H03F 1/0227 330/10 |

OTHER PUBLICATIONS

TIPO Office Action dated Dec. 23, 2016 in corresponding Taiwan application (No. 105102503).

* cited by examiner

*Primary Examiner* — Steven J Mottola
(74) *Attorney, Agent, or Firm* — McClure, Qualey & Rodack, LLP (57) ABSTRACT

A power amplifier circuit includes a power supply module and serially connected multi-stages of amplifier circuit. The multi-stages of amplifier circuit, coupled to the power supply module for amplifying an radio frequency (RF) input signal as an RF output signal, which include a driver stage of circuit and a gain stage of circuit. The driver stage of circuit receives and amplifies the RF input signal. The driver stage of circuit is powered by a first supply voltage received from the power supply module. The gain stage of circuit amplifies the signal received from previous stage of amplifier circuit and outputs the RF output signal. The gain stage of circuit is powered by a second supply voltage received from the power supply module. When the power amplifier circuit is operated in a back-off region, the first supply voltage is lower than the second supply voltage.

8 Claims, 5 Drawing Sheets

POWER AMPLIFIER CIRCUIT AND OPERATING METHOD THEREOF

This application claims the benefit of Taiwan application Serial No. 105102503, filed Jan. 27, 2016, the subject matter of which is incorporated herein by reference.

BACKGROUND OF THE INVENTION

Field of the Invention

The invention relates in general to a power amplifier circuit and an operating method thereof.

Description of the Related Art

The power amplifier circuit has been widely used in various electronic devices for converting an input signal into an output signal with larger power for transmission purpose. Generally speaking, the power amplifier has better output efficiency when the power amplifier is operated in a saturation region. However, in order to satisfy the amplitude variation for transmitting the modulation signal or due to power saving consideration, the power amplifier is usually operated in a back-off region having a lower output power to satisfy the linearity requirement or other system requirements. However, the power amplifier efficiency will be decreased when operated in the back-off region.

Therefore, it has become a prominent task for the industries to improve the efficiency when the power amplifier circuit is operated in a back-off region.

SUMMARY OF THE INVENTION

The invention is directed to a power amplifier circuit and an operating method thereof. In the amplifier circuit, a relatively lower supply voltage and a relatively higher supply voltage are respectively provided to the driver stage of circuit and the gain stage of circuit to effectively suppress the overhead caused by the driver stage of circuit, such that the efficiency obtained when the power amplifier circuit is operated in a back-off region can be increased.

According to an embodiment of the present invention, a power amplifier circuit is provided. The power amplifier circuit includes a power supply module and serially connected multi-stages of amplifier circuit. The multi-stages of amplifier circuit are coupled to the power supply module for amplifying a radio frequency (RF) input signal as an RF output signal. The multi-stages of amplifier circuit include a driver stage of circuit and a gain stage of circuit. The driver stage of circuit receives and amplifies the RF input signal. The driver stage of circuit is powered by a first supply voltage received from the power supply module. The gain stage of circuit amplifies the signal received from previous stage of amplifier circuit and outputs the RF output signal. The gain stage of circuit is powered by a second supply voltage received from the power supply module. When the power amplifier circuit is operated in a back-off region, the first supply voltage is lower than the second supply voltage.

According to another embodiment of the present invention, a power amplifier circuit is provided. The power amplifier circuit includes a power supply module and serially connected multi-stages of amplifier circuit. The multi-stages of amplifier circuit are coupled to the power supply module for amplifying an RF input signal as an RF output signal. The power supply module provides multiple supply voltages to power the multi-stages of amplifier circuit. At least two of the supply voltages have different voltage levels.

According to an alternate embodiment of the present invention, an operating method of power amplifier circuit is provided. The power amplifier circuit includes a power supply module and multi-stages of amplifier circuit. The multi-stages of amplifier circuit are coupled to and powered by the power supply module. The operating method includes following steps: A first supply voltage and a second supply voltage are generated using a power supply module. The second supply voltage is provided to the last stage of the multi-stages of amplifier circuit, and the first supply voltage is provided to at least one of the other stages of the multi-stages of amplifier circuit. When the power amplifier circuit is operated in a back-off region, the first supply voltage is lower than the second supply voltage.

The above and other aspects of the invention will become better understood with regard to the following detailed description of the preferred but non-limiting embodiment(s). The following description is made with reference to the accompanying drawings.

DETAILED DESCRIPTION OF THE INVENTION

A number of embodiments of the present invention are disclosed below with reference to accompanying drawings, but not every embodiment is illustrated in accompanying drawings. In practical application, the present invention can have different variations and is not limited to the embodiments exemplified in the specification. A number of embodiments are disclosed in the present disclosure to meet the statutory requirements. Designations common to the accompanying drawings are used to indicate identical or similar elements.

Figure 1:
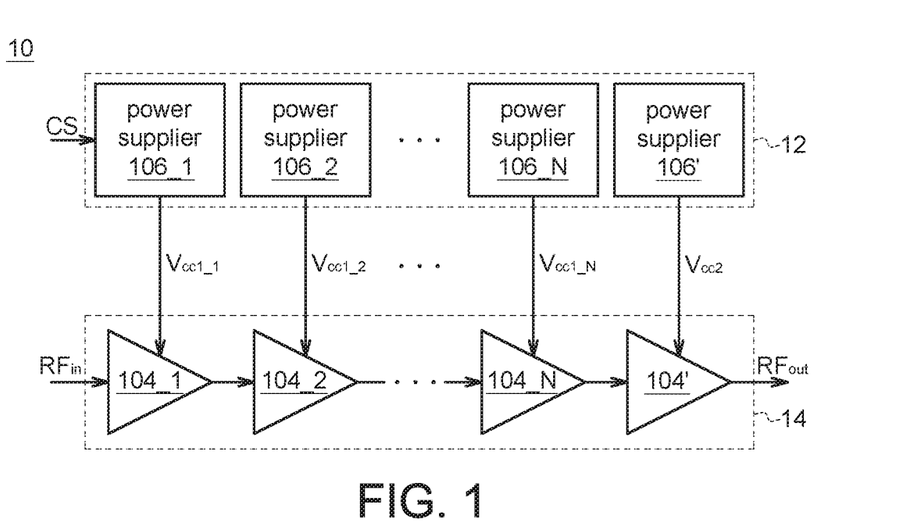
FIG. 1 shows a block diagram of a power amplifier circuit according to an embodiment of the present invention.

FIG. 1 shows a block diagram of a power amplifier circuit 10 according to an embodiment of the present invention. The power amplifier circuit 10 mainly includes a power supply module 12 and serially connected multi-stages of amplifier circuit 14. The power supply module 12 converts an external power (such as a battery) into a plurality of supply voltages (such as $V_{cc1\_1} \sim V_{cc1\_N}$, $V_{cc2}$) for powering the multi-stages of amplifier circuit 14. The power supply module 12 can be realized by such as a linear regulator or other power conversion circuit.

The multi-stages of amplifier circuit 14 are coupled to the power supply module 12 for amplifying an RF input signal $RF_{in}$ as an RF output signal $RF_{out}$. For example, the RF output signal $RF_{out}$ is outputted to an antenna (not illustrated) which further transmits the RF output signal $RF_{out}$ to the external.

The multi-stages of amplifier circuit 14 include one or multiple stages of circuits 104_1~104_N (N is a positive integer) and a gain stage of circuit 104'. It can be understood that a matching circuit (not illustrated) can be disposed between any two stages of circuit to improve the impedance matching effect. The first driver stage of circuit 104_1 receives and amplifies the RF input signal $RF_{in}$, and outputs an amplified RF signal from input signal $RF_{in}$ to the next stage of circuit. The N driver stages of circuit 104_1~104_N are respectively powered by the N first supply voltages $V_{cc1\_1} \sim V_{cc1\_N}$ received from the power supply module. The voltage levels of the N first supply voltages $V_{cc1\_1} \sim V_{cc1\_N}$ can be partly or totally equivalent to each other or can be totally different from each other. For example, suppose N=2. Then, the first supply voltage $V_{cc1\_1}$ received by the first driver stage of circuit 104_1 can be equivalent to or different from the first supply voltage $V_{cc1\_2}$ received by the second driver stage of circuit 104_2.

The gain stage of circuit 104' is disposed at the last stage of the multi-stages of amplifier circuit 14 for amplifying the signal received from previous stage of amplifier circuit (such as the $N^{th}$ driver stage of circuit 104_N) and outputting an RF output signal $RF_{out}$. The gain stage of circuit 104' is powered by the second supply voltage $V_{cc2}$ received from the power supply module 12.

According to an embodiment of the present invention, when the power amplifier circuit 10 is operated in a back-off region, the first supply voltage $V_{cc1\_1} \sim V_{cc1\_N}$ provided to the N driver stages of circuit 104_1~104_N all are lower than the second supply voltage $V_{cc2}$. In comparison to the design of providing the same supply voltage to each stage of amplifier circuit of the power amplifier circuit, the design of providing N relatively lower first supply voltages $V_{cc1\_1} \sim V_{cc1\_N}$ to the N driver stages of circuit 104_1~104_N effectively reduces the overhead of the N driver stages of circuit 104_1~104_N, and further reduces the efficiency loss caused by the N driver stages of circuit 104_1~104_N. Although the output power of the N driver stages of circuit 104_1~104_N may be reduced due to the decrease in the N first supply voltages $V_{cc1\_1} \sim V_{cc1\_N}$, the decrease can be compensated by providing a relatively higher second supply voltage $V_{cc2}$ to the gain stage of circuit 104', such that the overall output power can maintain at a necessary level. Thus, the efficiency when the power amplifier circuit 10 is operated in a back-off region can be effectively increased.

In an embodiment, the power supply module 12 outputs the N first supply voltages $V_{cc1\_1} \sim V_{cc1\_N}$ and the second supply voltage $V_{cc2}$ in response to an external power control signal CS. The power control signal CS is a power adjustment signal, such as a VRAMP signal, generated by a controller (not illustrated) with respect to the power amplifier circuit 10 according to the required power of signal transmission. In the example of FIG. 1, the power supply module 12 includes N power suppliers 106_1~106_N respectively coupled to the N driver stages of circuit 104_1~104_N for powering the N driver stages of circuit 104_1~104_N using the N first supply voltages $V_{cc1\_1} \sim V_{cc1\_N}$ according to the power control signal CS respectively. The power supply module 12 further includes a power supplier 106' coupled to the gain stage of circuit 104' for outputting the second supply voltage $V_{cc2}$ according to the power control signal CS to power the gain stage of circuit 104'. The said power suppliers 106_1~106_N and 106' can be individually used an independently power supply circuit. Or, sore or all of the power suppliers 106_1~106_N and 106' can be integrated as a power supply circuit.

When the power amplifier circuit 10 is operated in a back-off region, the power control signal CS enables the N first supply voltages Vcc1_~Vcc1_N outputted from the power supply module 12 to be lower than the second supply voltage Vcc2 so as to increase the efficiency of the power amplifier circuit 10. When the power amplifier circuit 10 is operated in a saturation region, the N first supply voltages Vcc1_~Vcc1_N and the second supply voltage Vcc2 tend to become equivalent to each other.

Figure 2:
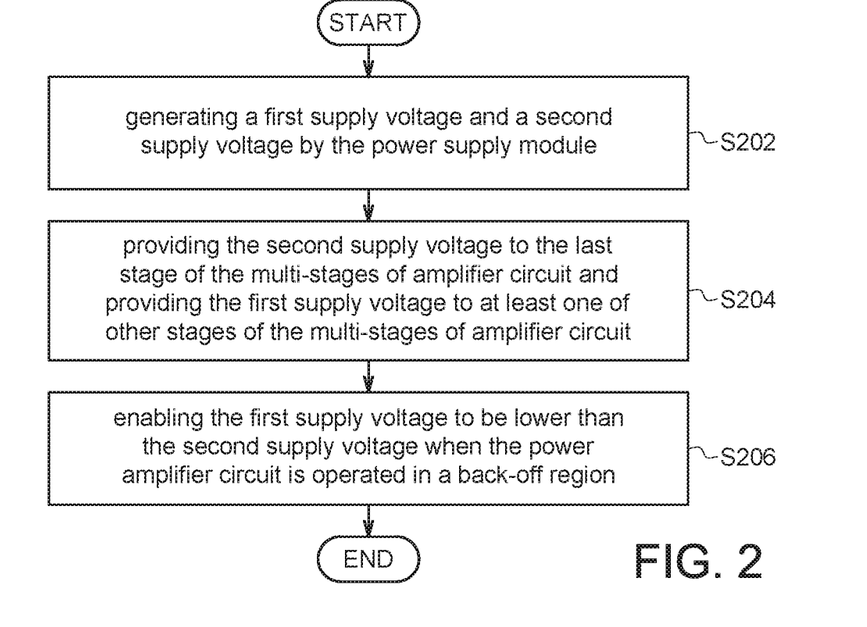
FIG. 2 shows a flowchart of an operating method of a power amplifier circuit according to an embodiment of the present invention.

FIG. 2 shows a flowchart of an operating method of a power amplifier circuit according to an embodiment of the present invention. Exemplarily but not restrictively, the said power amplifier circuit can be realized by the power amplifier circuit 10 of FIG. 1.

In step S202, the power amplifier circuit generates a first supply voltage and a second supply voltage using a power supply module. For example, the power supply module 12 of the power amplifier circuit 10 generates N first supply voltages $V_{cc1\_1} \sim V_{cc1\_N}$ and a second supply voltage $V_{cc2}$ in response to a power control signal CS.

In step S204, the power supply module provides a second supply voltage to the last stage of the multi-stages of amplifier circuit of the power amplifier circuit, and provides a first supply voltage to at least one of other stages of the multi-stages of amplifier circuit. For example, the power supply module 12 of the power amplifier circuit 10 provides a second supply voltage $V_{cc2}$ to the gain stage of circuit 104' and provides a first supply voltage $V_{cc1\_1}$ to the first driver stage of circuit 104_1.

In step S206, when the power amplifier circuit is operated in a back-off region, the power supply module enables the first supply voltage to be lower than the second supply voltage. For example, when the power amplifier circuit 10 is operated in a back-off region, the power supply module 12 of the power amplifier circuit 10 outputs a relatively lower first supply voltage $V_{cc1\_1}$ and a relatively higher second supply voltage $V_{cc2}$ in response to the power control signal CS, so as to increase the efficiency when the power amplifier circuit 10 is operated in a back-off region.

Figure 3:
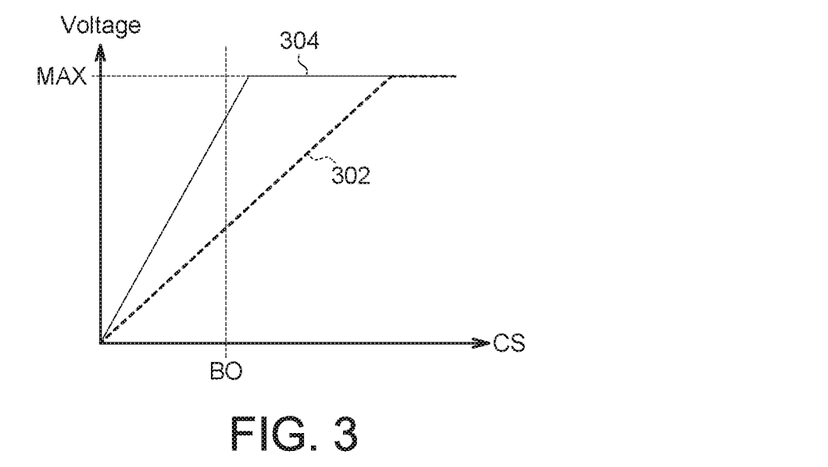
FIG. 3 shows an example of the relationship between the first and second supply voltages vs the power control signal.

FIG. 3 shows an example of the relationship between the first and second supply voltages vs the power control signal CS. Exemplarily but not restrictively, the said first supply voltage can be realized by one of the N first supply voltages $V_{cc1\_1} \sim V_{cc1\_N}$ of FIG. 1. Exemplarily but not restrictively, the said second supply voltage can be realized by the second supply voltage $V_{cc2}$ of FIG. 1.

The curve 302 of FIG. 3 represents the relationship between the first supply voltage and the power control signal CS. The curve 304 represents the relationship between the second supply voltage and the power control signal CS.

Before the first supply voltage and the second supply voltage reach a maximum value (MAX), the voltage ramp-up generated when the first supply voltage varies with the power control signal CS (corresponding to curve 302) is lower than the voltage ramp-up generated when the second supply voltage varies with the power control signal CS (corresponding to curve 304). Based on the above characteristics, when the value of the power control signal CS indicates that the power amplifier circuit is operated in a back-off region (for example, when the value of CS=BO), the first supply voltage is lower than the second supply voltage.

However the present invention is not limited thereto. In some embodiments, the first supply voltage and the second supply voltage can vary with the power control signal CS in other linear patterns or non-linear patterns as long as the power control signal CS can enable the first supply voltage to be lower than the second supply voltage when the power amplifier circuit is operated in a back-off region.

The operating mechanism and generated benefits of the power amplifier circuit of the present invention are disclosed below with the simulation results of FIGS. 4-9.

Figure 4:
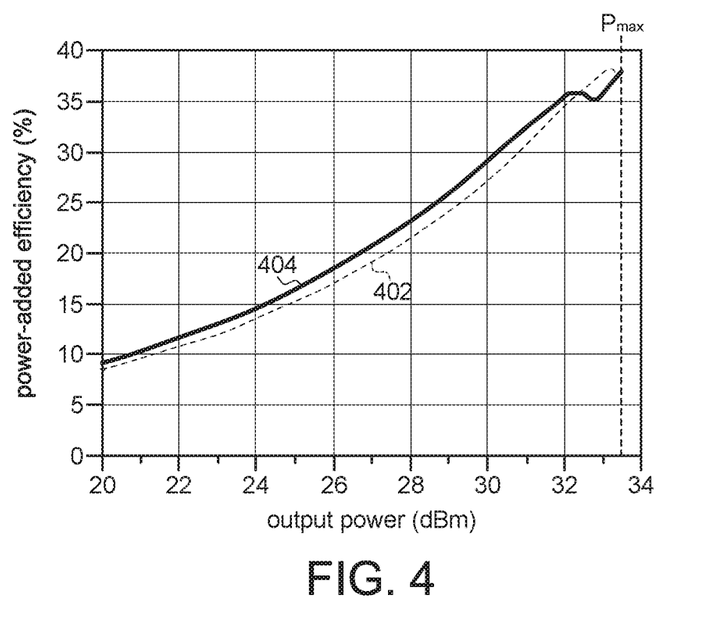
FIG. 4 shows a relationship curve diagram of the power-added efficiency (PAE) vs the output power of a power amplifier circuit under different power supply schemes.

FIG. 4 shows a relationship curve diagram of the power-added efficiency (RAE) vs output power of a power amplifier circuit under different power supply schemes. The curve 402 of FIG. 4 represents the relationship between the power-added efficiency and the output power of the power amplifier circuit when each stage of the amplifier circuit only receives one single supply voltage (hereinafter referred as the first power supply scheme). The curve 404 represents the relationship between the power-added efficiency and the output power of the power amplifier circuit when a relatively lower supply voltage and a relatively higher supply voltage are provided to the driver stage of the amplifier circuit and the gain stage of circuit, respectively (hereinafter referred as the second power supply scheme). As indicated in FIG. 4, suppose the output power is lower than 32 dBm when the power amplifier circuit is operated in a back-off region. Then, the power-added efficiency of the amplifier circuit under the second power supply scheme is increased by 2%-3% in comparison to the power-added efficiency of the amplifier circuit under the first power supply scheme. It should be noted that near the maximum output power $P_{max}$, the power-added efficiencies of the amplifier circuit are almost equivalent under the two power supply schemes. In other words, when the amplifier circuit is under the second power supply scheme, the best power-added efficiency of the power amplifier circuit at the maximum output power $P_{max}$ still can be maintained.

Figure 5:
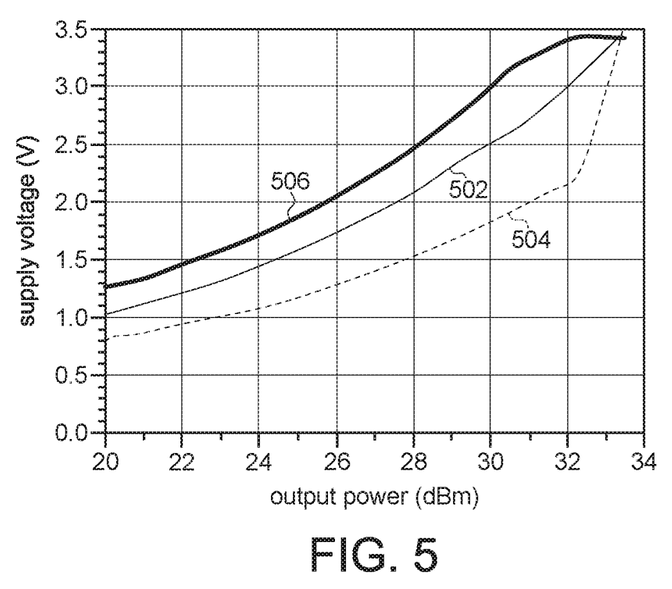
FIG. 5 shows a relationship curve diagram of the supply voltage of a power supply module vs the output power of a power amplifier circuit under different power supply schemes.

FIG. 5 shows a relationship curve diagram of the supply voltage of a power supply module vs the output power of a power amplifier circuit under different power supply schemes. The curve 502 indicates the variation in the one single supply voltage provided to each of the amplifier circuits under the first power supply scheme. The curves 504 and 506 indicate the variation in the supply voltages provided to the driver stage of circuit and the gain stage of circuit respectively under the second power supply scheme. As indicated in FIG. 5, when the power amplifier circuit is operated in a back-off region (such as a output power is smaller than 32 dBm), the supply voltage provided to the driver stage of circuit under the second power supply scheme is lower than that provided to the first power supply scheme, but the supply voltage provided to the gain stage of circuit under the second power supply scheme is higher than that provided to the first power supply scheme.

Figure 6:
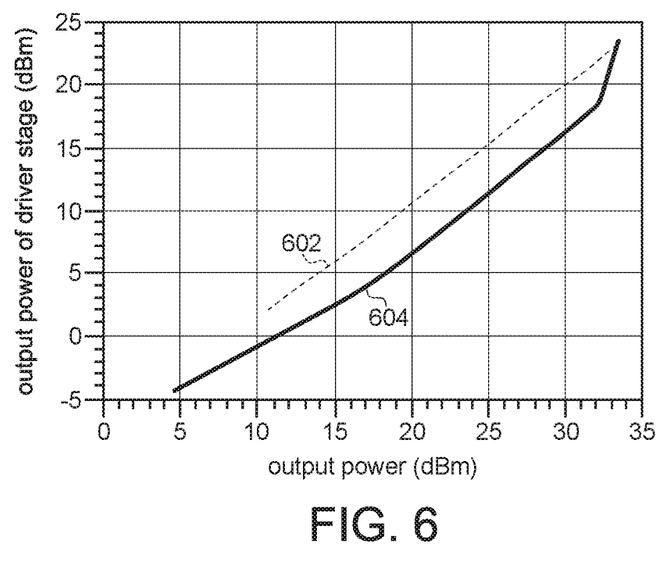
FIG. 6 shows a relationship curve diagram of the output power of a driver stage of circuit vs the output power of a power amplifier circuit under different power supply schemes.

FIG. 6 shows a relationship curve diagram of the output power of a driver stage of circuit vs the output power of a power amplifier circuit under different power supply schemes. The curves 602 and 604 of FIG. 6 represent the relationship between the output power of a driver stage of circuit and the output power of a power amplifier circuit under the first and the second power supply schemes, respectively. Since the supply voltage provided to the driver stage of circuit under the second power supply scheme is relatively lower than that under the first power supply scheme, the output power of the driver stage of circuit under the second power supply scheme is lower than that under the first power supply scheme.

Figure 7:
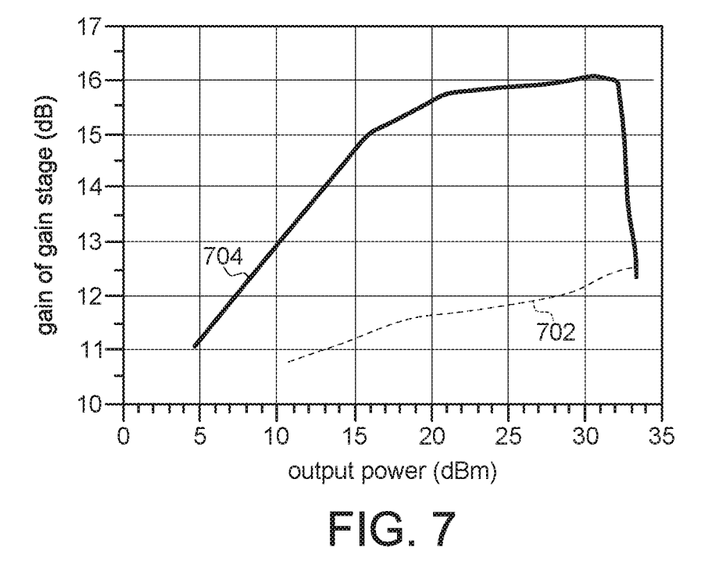
FIG. 7 shows a relationship curve diagram of the gain at a gain stage of circuit vs the output power of a power amplifier circuit under different power supply schemes.

FIG. 7 shows a relationship curve diagram of the gain at a gain stage of circuit vs the output power of a power amplifier circuit under different power supply schemes. The curves 702 and 704 of FIG. 7 represent the relationship between the gain of the gain stage of circuit and the output power of a power amplifier circuit under the first and the second power supply schemes, respectively. Since the supply voltage provided to the gain stage of circuit under the second power supply scheme is relatively higher than that under the first power supply scheme, the gain at the gain stage of circuit under the second power supply scheme is significantly higher than that under the first power supply scheme. Under the second power supply scheme, the gain increase of the gain stage of circuit can effectively compensate the loss in the output power of the driver stage of circuit, therefore the output power of the power amplifier circuit can maintain almost equivalent under the two power supply schemes to each other.

Figure 8:
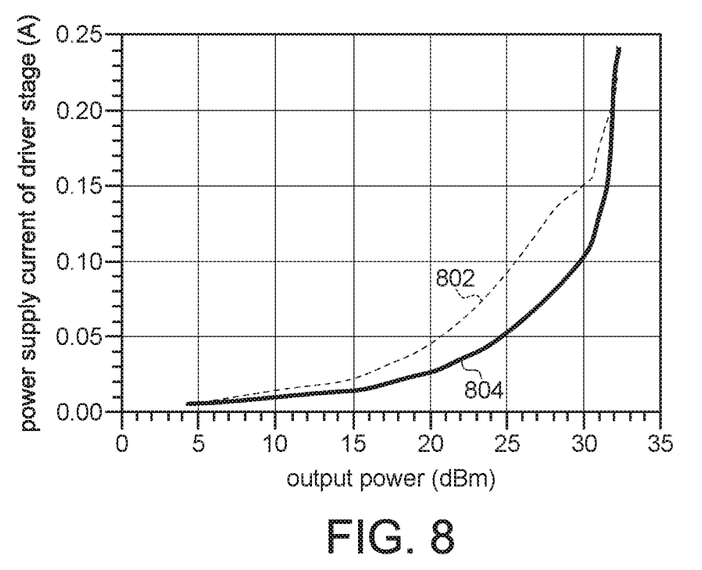
FIG. 8 shows a relationship curve diagram of the power supply current at a driver stage of circuit vs the output power of a power amplifier circuit under different power supply schemes.

FIG. 8 shows a relationship curve diagram of the power supply current at a driver stage of circuit vs the output power of a power amplifier circuit under different power supply schemes. The curves 802 and 804 of FIG. 8 represent the relationship between the power supply current at a driver stage of circuit and the output power of a power amplifier circuit under the first and the second power supply schemes, respectively. As indicated in FIG. 8, the power supply current consumed by the driver stage of circuit is greatly reduced under the second power supply scheme. Therefore, when the power amplifier circuit is operated in a back-off region, the overhead caused by the driver stage of circuit under the second power supply scheme is significantly smaller than that caused under the first power supply scheme.

Figure 9:
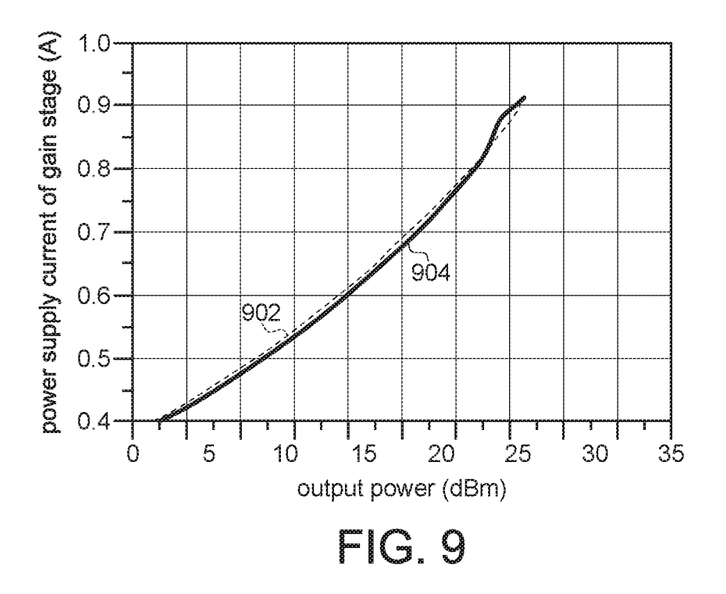
FIG. 9 shows a relationship curve diagram of the power supply current at a gain stage of circuit vs the output power of a power amplifier circuit under different power supply schemes.

FIG. 9 shows a relationship curve diagram of the power supply current at a gain stage of circuit vs the output power of a power amplifier circuit under different power supply schemes. The curves 902 and 904 of FIG. 9 represent the relationship between the power supply current at a gain stage of circuit vs the output power of a power amplifier circuit under the first and the second power supply schemes, respectively. As indicated in FIG. 9, although the supply voltage provided to the gain stage of circuit under the second power supply scheme is relatively higher than that under the first power supply scheme, the power supply current consumed by the gain stage of circuit under the second power supply scheme is almost equivalent to (only slightly lower than) that consumed under the first power supply scheme. In other words, the efficiency loss caused by the gain stage of circuit almost does not increase under the second power supply scheme.

Figure 10:
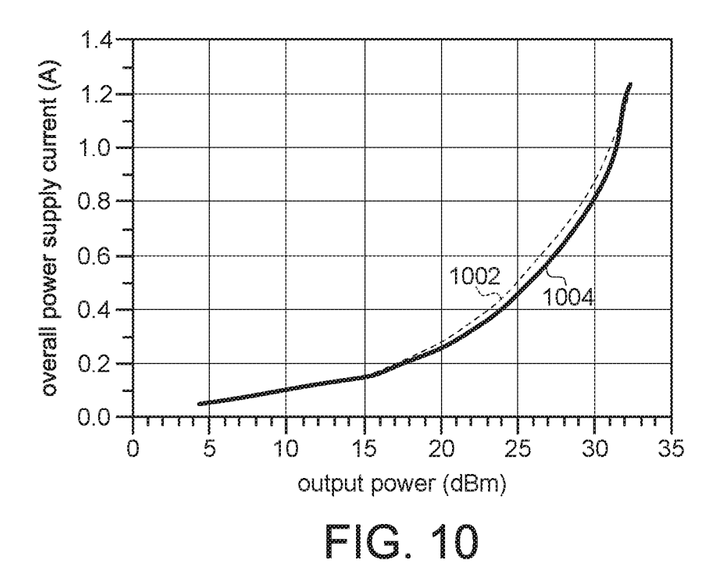
FIG. 10 shows a relationship curve diagram of the overall power supply current vs the output power of a power amplifier circuit under different power supply schemes.

FIG. 10 shows a relationship curve diagram of the overall power supply current vs the output power of a power amplifier circuit under different power supply schemes. The curves 1002 and 1004 of FIG. 10 represent the relationship between the overall power supply current of an amplifier circuit and the output power of a power amplifier circuit under the first and the second power supply schemes, respectively. As disclosed above, the power supply current consumed by the driver stage of circuit under the second power supply scheme is significant lower that consumed under the first power supply scheme, but the power supply current consumed by the gain stage of circuit almost remains the same under the two schemes. As indicated in FIG. 10, when the power amplifier circuit is operated in a back-off region, the overall power supply current consumed by the amplifier circuit under the second power supply scheme is significantly lower than that consumed under the first power supply scheme.

According to the power amplifier circuit and the operating method thereof disclosed in above embodiments of the present invention, in the amplifier circuit, a relatively lower supply voltage and a relatively higher supply voltage are respectively provided to the driver stage of circuit and the gain stage of circuit to effectively suppress the overhead caused by the driver stage of circuit, such that the efficiency obtained when the power amplifier circuit is operated in a back-off region can be increased.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A power amplifier circuit, comprising:
a power supply module; and
serially connected multi-stages of amplifier circuit coupled to the power supply module for amplifying an radio frequency (RF) input signal as an RF output signal, wherein the multi-stages of amplifier circuit comprise:
a driver stage of circuit for receiving and amplifying the RF input signal, wherein the driver stage of circuit is powered by a first supply voltage received from the power supply module; and
a gain stage of circuit for amplifying the signal received from previous stage of amplifier circuit and outputting the RF output signal, wherein the gain stage of circuit is powered by a second supply voltage received from the power supply module;
wherein when the power amplifier circuit is operated in a back-off region, the first supply voltage is lower than the second supply voltage;
wherein before the first supply voltage and the second supply voltage reach a maximum value, the voltage ramp-up generated when the first supply voltage varies with a power control signal is smaller than the voltage ramp-up generated when the second supply voltage varies with the power control signal.

2. The power amplifier circuit according to claim 1, wherein the power supply module outputs the first supply voltage and the second supply voltage in response to the power control signal.

3. The power amplifier circuit according to claim 2, wherein the power supply module comprises:
a first power supplier coupled to the driver stage of circuit for outputting the first supply voltage to power the driver stage of circuit according to the power control signal; and a second power supplier coupled to the gain stage of circuit for outputting the second supply voltage to power the gain stage of circuit according to the power control signal.

4. The power amplifier circuit according to claim 2, wherein when the power amplifier circuit is operated in a back-off region, the power control signal enables the first supply voltage outputted from the power supply module to be lower than the second supply voltage.

5. The power amplifier circuit according to claim 1, wherein the multi-stages of amplifier circuit further comprises:
another driver stage of circuit coupled between the driver stage of circuit and the gain stage of circuit, wherein the another driver stage of circuit is powered by another first supply voltage received from the power supply module;
wherein when the power amplifier circuit is operated in a back-off region, the another first supply voltage is lower than the second supply voltage.

6. A power amplifier circuit, comprising:
a power supply module; and
serially connected multi-stages of amplifier circuit coupled to the power supply module for amplifying an RF input signal as an RF output signal;
wherein the power supply module provides a plurality of supply voltages to power the multi-stages of amplifier circuit, and at least two of the supply voltages have different voltage levels;
when the power amplifier circuit is operated in a back-off region, the voltage level of the supply voltage provided to the last stage of the multi-stages of amplifier circuit by the power supply module is larger than the level of the supply voltage provided to other stages of the multi-stages of amplifier circuit;
wherein before the supply voltages reach a maximum value, one of the voltage ramp-up generated when one of the supply voltages varies with a power control signal is smaller than the voltage ramp-up generated when another of the supply voltages varies with the power control signal.

7. The power amplifier circuit according to claim 6, wherein the power supply module generates the supply voltages according to the power control signal.

8. An operating method of power amplifier circuit, wherein the power amplifier circuit comprises a power supply module and serially connected multi-stages of amplifier circuit, the serially connected multi-stages of amplifier circuit are coupled to and powered by the power supply module, and the operating method comprises:
generating a first supply voltage and a second supply voltage using the power supply module;
providing a second supply voltage to the last stage of the multi-stages of amplifier circuit and providing a first supply voltage to at least one of other stages of the multi-stages of amplifier circuit; and
enabling the first supply voltage to be lower than the second supply voltage when the power amplifier circuit is operated in a back-off region;
wherein the operating method further comprises:
generating the first supply voltage and the second supply voltage according to a power control signal; and
before the first supply voltage and the second supply voltage reach a maximum value, enabling the voltage ramp-up generated when the first supply voltage varies with the power control signal to be smaller than the voltage ramp-up generated when the second supply voltage varies with the power control signal.

* * * * *